(12) United States Patent
Bhuyan et al.

(10) Patent No.: US 11,990,369 B2
(45) Date of Patent: May 21, 2024

(54) SELECTIVE PATTERNING WITH MOLECULAR LAYER DEPOSITION

(71) Applicant: Applied Materials, Inc., Santa Clara, CA (US)

(72) Inventors: Bhaskar Jyoti Bhuyan, San Jose, CA (US); Zeqing Shen, San Jose, CA (US); Susmit Singha Roy, Sunnyvale, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 252 days.

(21) Appl. No.: 17/407,504

(22) Filed: Aug. 20, 2021

(65) Prior Publication Data

US 2023/0057258 A1 Feb. 23, 2023

(51) Int. Cl.
*H01L 21/768* (2006.01)
*H01L 21/02* (2006.01)
(Continued)

(52) U.S. Cl.
CPC .. *H01L 21/76877* (2013.01); *H01L 21/02118* (2013.01); *H01L 21/31133* (2013.01);
(Continued)

(58) Field of Classification Search
CPC ......... H01L 21/76877; H01L 21/31133; H01L 21/76834; H01L 21/76837; H01L 21/02118; B05D 1/60; B05D 1/62
See application file for complete search history.

(56) References Cited

U.S. PATENT DOCUMENTS

| 4,078,963 A | 3/1978 | Symersky |
| 6,222,279 B1 | 4/2001 | Mis et al. |

(Continued)

FOREIGN PATENT DOCUMENTS

| JP | 2010093284 A | 4/2010 |
| JP | 4493516 B2 | 6/2010 |

(Continued)

OTHER PUBLICATIONS

International Search Report and Written Opinion dated Nov. 30, 2022 in International Patent Application No. PCT/US2022/040110, 9 pages.

*Primary Examiner* — David Vu
*Assistant Examiner* — Brandon C Fox
(74) *Attorney, Agent, or Firm* — Kilpatrick Townsend & Stockton LLP

(57) ABSTRACT

Exemplary methods of semiconductor processing may include forming a layer of carbon-containing material on a substrate disposed within a processing region of a semiconductor processing chamber. The substrate may include an exposed region of a first dielectric material and an exposed region of a metal-containing material. The layer of carbon-containing material may be selectively formed over the exposed region of the metal-containing material. Forming the layer of carbon-containing material may include one or more cycles of providing a first molecular species that selectively couples with the metal-containing material. Forming the layer of carbon-containing material may include providing a second molecular species that selectively couples with the first molecular species. The methods may include selectively depositing a second dielectric material on the exposed region of the first dielectric material.

20 Claims, 5 Drawing Sheets

(51) Int. Cl.
*H01L 21/311* (2006.01)
*B05D 1/00* (2006.01)

(52) U.S. Cl.
CPC .. *H01L 21/76834* (2013.01); *H01L 21/76837* (2013.01); *B05D 1/60* (2013.01); *B05D 1/62* (2013.01)

(56) References Cited

U.S. PATENT DOCUMENTS

| | | | |
|---|---|---|---|
| 6,936,923 | B2 | 8/2005 | Lin et al. |
| 7,491,556 | B2 | 2/2009 | Jungnickel et al. |
| 7,550,849 | B2 | 6/2009 | Mis et al. |
| 7,585,759 | B2 | 9/2009 | Kuechenmeister et al. |
| 8,178,967 | B2 | 5/2012 | Lee et al. |
| 8,637,402 | B2 | 1/2014 | Hu et al. |
| 9,369,175 | B2 | 6/2016 | Lee et al. |
| 9,875,978 | B2 | 1/2018 | Gatterbauer et al. |
| 2007/0085213 | A1 | 4/2007 | Ahn et al. |
| 2011/0115096 | A1 | 5/2011 | Bradl et al. |
| 2017/0352533 | A1 | 12/2017 | Tois et al. |
| 2018/0218914 | A1* | 8/2018 | Basu ............... H01L 21/76801 |
| 2019/0157076 | A1 | 5/2019 | Hausmann et al. |
| 2019/0157079 | A1 | 5/2019 | Ke et al. |
| 2020/0168503 | A1* | 5/2020 | Roy ................... H01L 21/02115 |
| 2020/0216949 | A1 | 7/2020 | Bhuyan et al. |
| 2021/0115559 | A1 | 4/2021 | Sharma et al. |
| 2021/0134586 | A1 | 5/2021 | Maes et al. |
| 2021/0175118 | A1 | 6/2021 | Negreira et al. |
| 2021/0313179 | A1 | 10/2021 | Meier et al. |
| 2022/0068704 | A1* | 3/2022 | Shin .................... H01L 21/7685 |
| 2023/0062128 | A1* | 3/2023 | Li ...................... H01L 21/76867 |

FOREIGN PATENT DOCUMENTS

| | | |
|---|---|---|
| KR | 20210052537 A | 5/2021 |
| TW | I332240 B | 10/2010 |
| TW | 201703124 A | 1/2017 |
| TW | 202301607 A | 1/2023 |

* cited by examiner

SELECTIVE PATTERNING WITH MOLECULAR LAYER DEPOSITION

TECHNICAL FIELD

The present technology relates to systems and methods for semiconductor processing. More specifically, the present technology relates to systems and methods for selectively forming molecular layers on semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, and device complexity continues to increase, producing structures has become increasingly complex. Developing structures may take many more operations to produce the complex patterning and material integration. Additionally, as the number of material layers being patterned during processing is expanding, producing materials that may have improved removal selectivity to other exposed materials is becoming a greater challenge, along with maintaining material properties.

Thus, there is a need for improved systems and methods that can be used to produce high quality devices and structures. These and other needs are addressed by the present technology.

SUMMARY

Exemplary methods of semiconductor processing may include forming a layer of carbon-containing material on a substrate disposed within a processing region of a semiconductor processing chamber. The substrate may include an exposed region of a first dielectric material and an exposed region of a metal-containing material. The layer of carbon-containing material may be selectively formed over the exposed region of the metal-containing material. Forming the layer of carbon-containing material may include one or more cycles of providing a first molecular species that selectively couples with the metal-containing material. Forming the layer of carbon-containing material may include providing a second molecular species that selectively couples with the first molecular species. The methods may include selectively depositing a second dielectric material on the exposed region of the first dielectric material.

In some embodiments, the layer of carbon-containing material may be formed to a thickness of greater than or about 5 nm. Forming the layer of carbon-containing material may be performed at a substrate temperature of greater than or about 100° C. The methods may include performing an etch of the layer of carbon-containing material to expose the first dielectric material. The methods may include removing the layer of carbon-containing material by oxidizing the carbon-containing material or annealing the carbon-containing material. The metal-containing material may include a first metal-containing material. The methods may include forming a second metal-containing material on the first metal-containing material. The first molecular species may be characterized by a head group comprising an amine, diamine, diol, or dithiol. The second molecular species may be characterized by a head group comprising oxygen. Selectively depositing the second dielectric material may include a plasma-enhanced deposition. Forming the layer of carbon-containing material may include at least 10 cycles.

Some embodiments of the present technology may encompass semiconductor processing methods. The methods may include forming a layer of carbon-containing material on a substrate disposed within a processing region of a semiconductor processing chamber. The substrate may include an exposed region of a dielectric material and an exposed region of a metal-containing material. The layer of carbon-containing material may be selectively formed over the exposed region of the metal-containing material to a thickness of at least twice a thickness formed on the dielectric material. The methods may include selectively depositing a second dielectric material on the exposed region of the dielectric material.

In some embodiments, forming the layer of carbon-containing material may include one or more cycles of providing a first molecular species that selectively couples with the metal-containing material, and providing a second molecular species that selectively couples with the first molecular species. The methods may include removing the layer of carbon-containing material by oxidizing the carbon-containing material or annealing the carbon-containing material. The layer of carbon-containing material may be formed to a thickness of greater than or about 5 nm. The metal-containing material may include a first metal-containing material. The methods may include forming a second metal-containing material on the first metal-containing material. Forming the layer of carbon-containing material may be performed at a substrate temperature of greater than or about 100° C. The methods may include performing an etch of the layer of carbon-containing material to expose the dielectric material.

Some embodiments of the present technology may encompass semiconductor processing methods. The methods may include forming a layer of carbon-containing material on a substrate disposed within a processing region of a semiconductor processing chamber at a substrate temperature of greater than or about 100° C. The substrate may include an exposed region of a first dielectric material and an exposed region of a metal-containing material. The layer of carbon-containing material may be selectively formed over the exposed region of the metal-containing material. Forming the layer of carbon-containing material may include one or more cycles of providing a first molecular species that selectively couples with the metal-containing material. The first molecular species may include an amine head group. Forming the layer of carbon-containing material may include one or more cycles of providing a second molecular species that selectively couples with the first molecular species. The second molecular species may include oxygen. The methods may include selectively depositing a second dielectric material on the exposed region of the first dielectric material.

In some embodiments, the methods may include performing an etch of the layer of carbon-containing material to expose the first dielectric material. The methods may include removing the layer of carbon-containing material by oxidizing the carbon-containing material or annealing the carbon-containing material.

Such technology may provide numerous benefits over conventional systems and techniques. For example, embodiments of the present technology may produce selectively deposited blocking materials on certain exposed materials, which may allow subsequent selective deposition on other exposed materials. Additionally, the present technology may produce sacrificial blocking materials that can be more readily removed from substrates, even at increased thicknesses. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
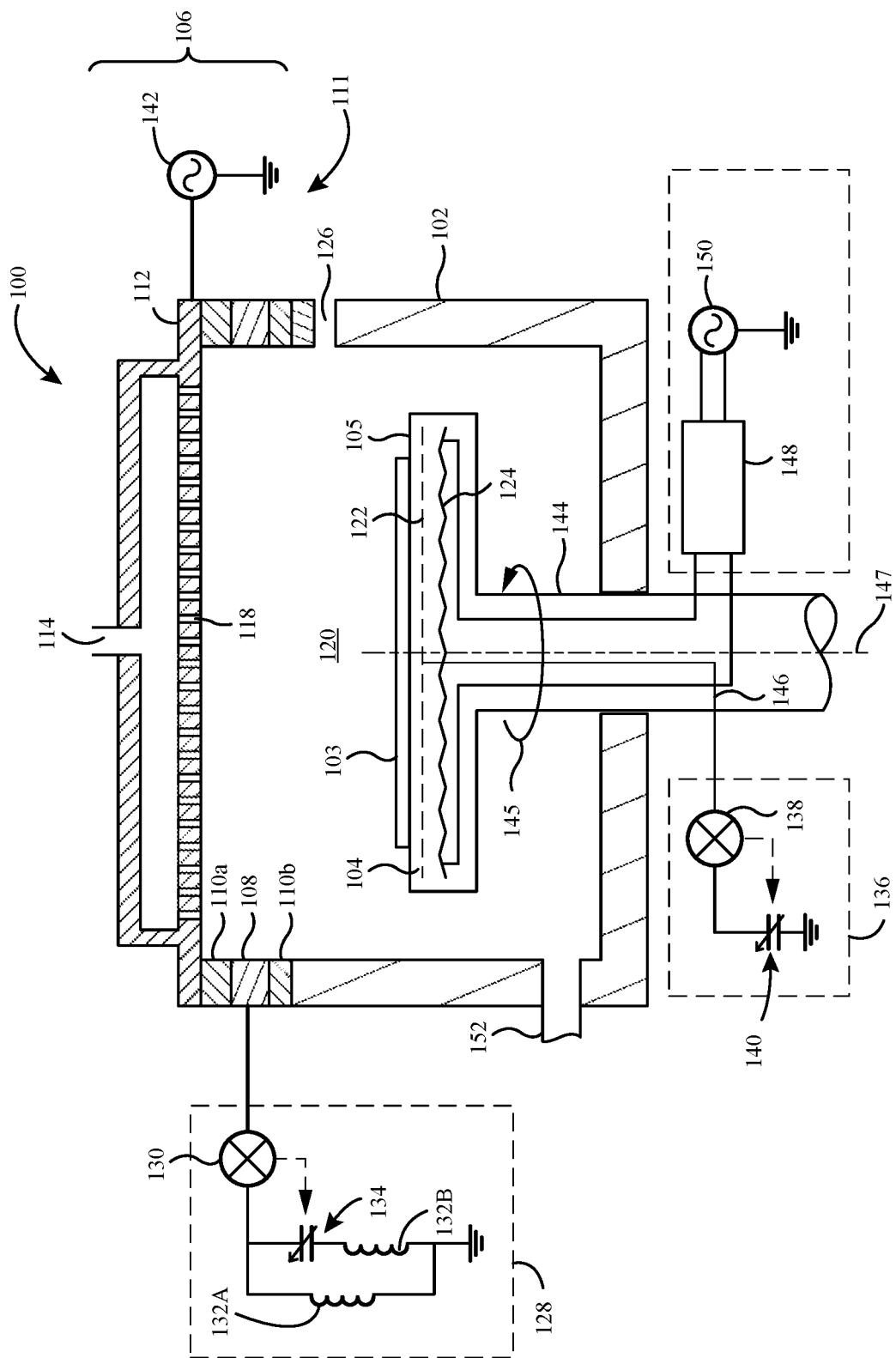
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Forming material on some regions of the substrate and different materials on other regions is becoming increasingly complex. Additionally, as the number of materials on a surface to be processed may increase, newer materials may be utilized to increase selectivity during subsequent removal or processing. As one non-limiting example, selectively depositing sacrificial films may allow certain materials to be blocked while deposition may proceed on other regions of the substrate. This may allow process flows with reduced patterning operations and protection of exposed materials from selective removal processes that can still cause damage or pitting in the deposited films.

Conventional technologies have struggled to produce selectively deposited sacrificial layers that provide sufficient protection for subsequent deposition operations. For example, some conventional technologies have explored the use of self-assembled monolayers to provide regional blocking on certain materials on a substrate. However, self-assembled monolayers have several limitations. For example, the layers may often be grown only to a few nanometers or less, which may limit the ability to deposit thicker films on the unblocked regions. Additionally, self-assembled monolayers lose selectivity for a number of reasons. The layers may have incomplete coverage or reactivity with subsequent atomic-layer deposition precursors, which may create voids or defects allowing subsequent growth in the blocked regions. Self-assembled monolayers are also limited in applicability due to thermal instability causing them to decompose at higher temperature. Finally, self-assembled monolayers will decompose when contacted by plasma effluents, limiting the technology to subsequent deposition by atomic-layer deposition, or thermal deposition processes. Accordingly, many conventional technologies have been limited in the ability to incorporate blocking materials to facilitate selective deposition.

The present technology overcomes these issues by performing selective molecular layer deposition on materials exposed on the substrate to produce blocking layers. Unlike conventional technologies, the presently disclosed materials and techniques may facilitate formation of increased thickness blocking materials, that may also be readily removed with little impact on other deposited material. Additionally, the present materials may be capable of selectively blocking metals and allowing a number of deposition operations to be performed, while maintaining a blocking functionality.

Although the remaining disclosure will routinely identify specific deposition processes utilizing the disclosed technology, and will describe one type of semiconductor processing chamber, it will be readily understood that the processes described may be performed in any number of semiconductor processing chambers. Additionally, the present technology may be applicable to any number of semiconductor processes, beyond the exemplary process described below. For example, the present technology may facilitate processes including selective deposition at back end of line, self-aligned via formation, and any number of additional processes in which blocking materials may be used to facilitate deposition on some exposed surfaces and not others. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
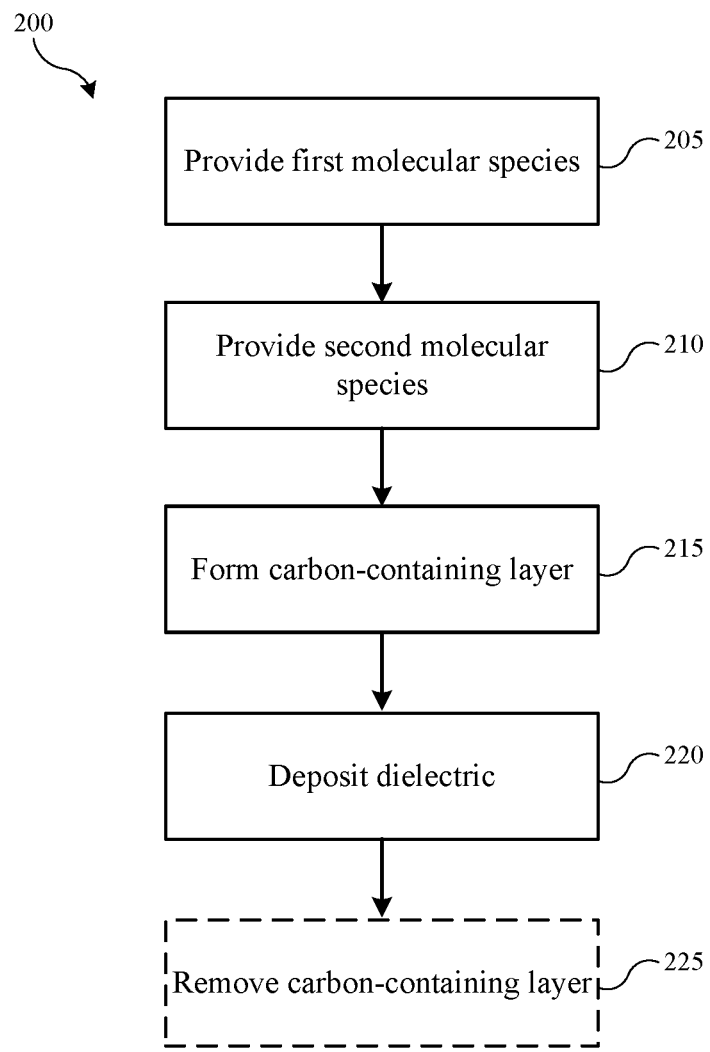
FIG. 2 shows operations in a semiconductor processing method according to some embodiments of the present technology.

Although a plasma-processing chamber may be used for one or more aspects of film processing, in some embodiments forming molecular layer deposition films may not utilize a plasma-enhanced process for some or all of the operations, although the processes may partially or fully be performed in chambers in which plasma may be formable for subsequent deposition. The present technology may at least form selective blocking layers without plasma generation, in some embodiments. FIG. 2 shows exemplary operations in a processing method 200 according to some embodiments of the present technology. The method may be performed in a variety of processing chambers, including processing chamber 100 described above, as well as any other chambers in which the operations may be performed. Method 200 may include one or more operations prior to the initiation of the method, including front-end processing, deposition, etching, polishing, cleaning, or any other operations that may be performed prior to the described operations. The methods may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3E, the illustrations of which will be described in conjunction with the operations of method 200. It is to be understood that the figures illustrate only partial schematic views, and a substrate may contain any number of additional materials and features having a variety of characteristics and aspects as illustrated in the figures. Additionally, it is to be understood that the figures illustrate just one exemplary process in which molecular layer deposition according to embodiments of the present technology may be employed, and the description is not intended to limit the technology to this process alone.

Figure 3A:
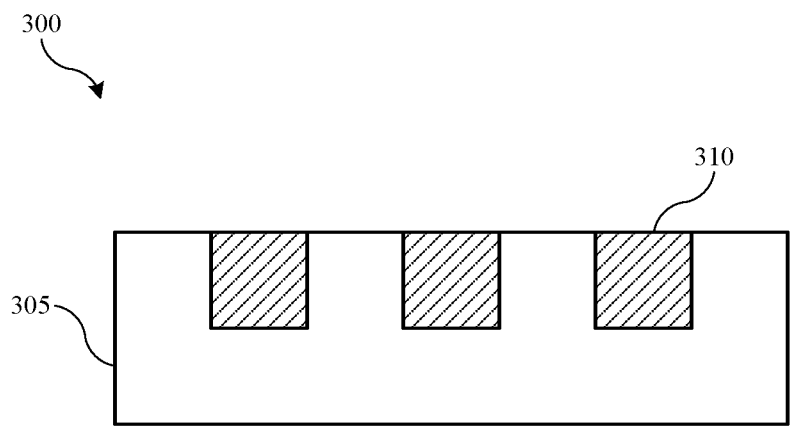
FIGS. 3A-3E show exemplary schematic cross-sectional structures in which material layers are included produced according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structures on which a selective deposition material may be formed. As illustrated in FIG. 3A substrate 305 may be processed to a position in which multiple materials may be exposed along a surface of the substrate. Substrate 305 may be any number of materials, such as a base wafer or substrate made of silicon or silicon-containing materials, germanium, other substrate materials, as well as one or more materials that may be formed overlying the substrate during semiconductor processing.

For example, in some embodiments the substrate may be processed to include one or more materials or structures for semiconductor processing. Substrate 305 may be or include a dielectric material, such as an oxide or nitride of any number of materials, and features or recesses formed may provide access to one or more underlying materials. Vias, trenches, or other features may be formed in which an amount of metal-containing material 310 may be included and exposed on the substrate. For example, substrate 305 may be an inter-layer dielectric material in which metal-containing material 310 may be exposed. Metal-containing material 310 may be a metal plug of cobalt, tungsten, copper, ruthenium, molybdenum, or any number of other metals, including transition metals, which may include pristine metal materials, as well as metal materials with a native or other oxide, and which may be formed in any structure. Planarization or some other process may provide a structure as illustrated in which both a dielectric material and a metal-containing material may be exposed along a surface of the substrate. Although only a few features are shown in the figure, it is to be understood that exemplary structures may have any number of features defined along the structure according to embodiments of the present technology.

Method 200 may include selectively forming a carbon-containing material on the exposed metal-containing materials by performing a molecular layer deposition. As explained above, unlike self-assembled monolayers, which may be limited in carbon chains, the present technology may provide blocking coverage of several nanometers or more, which may facilitate thicker deposition in subsequent processing. For example, without scaled blocking, the deposition may overcome the blocking layer and produce blanket coverage over the structure, which may trap the blocking material. Additionally, while self-assembled monolayers may be fully decomposed by plasma processing, blocking layers according to some embodiments of the present technology may be resistant to plasma exposure, which may allow plasma-enhanced deposition to be performed.

Forming the blocking layer may include a sequential process of molecular layer deposition. For example, a first molecular species may be provided to the substrate at operation 205. The first molecular species may selectively couple with the exposed metal-containing material, such as metal 310, which may be any of the materials discussed above. The material may not effectively couple, or may have reduced coupling, with the exposed dielectric material, such as silicon oxide or silicon nitride, among any number of other dielectric materials. After sufficient exposure to the first molecular species, a purge operation may be performed. At operation 210, a second molecular species may be provided, and which may selectively couple with the first molecular species.

Figure 3B:
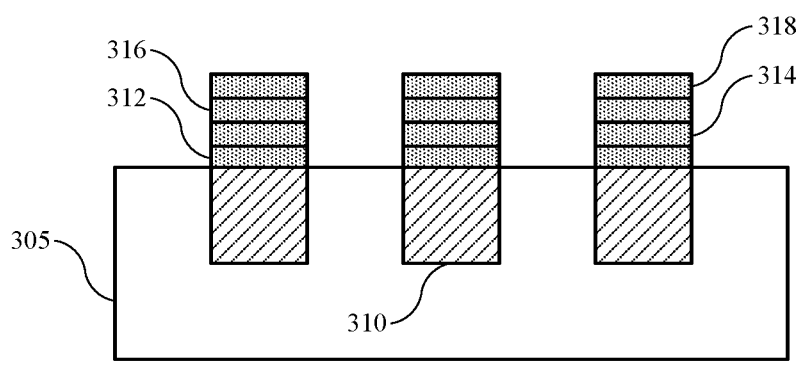

As illustrated in FIG. 3B, the first molecular species may be characterized by a head group that adsorbs or otherwise couples with the exposed surface of the metal-containing material 310, and which may produce a first molecular layer 312 overlying the metal-containing material. The second molecular species may couple specifically with the first molecular species, allowing a second molecular layer 314 to form overlying the first molecular layer 312. The process then may be repeated for any number of cycles to produce a blocking layer of sufficient thickness. For example, after the second molecular species is purged, the first molecular species may be provided again, which may couple with the second molecular species and form another first molecular layer 316. The processing region may then be purged, and the second molecular species may be provided to form another second molecular layer 318. Although four such layers are shown, it is to be understood that any number of cycles may be performed, which may include dozens of layers in some embodiments.

Depending on the thickness desired, the cycle may be repeated greater than or about 2 times, and may be repeated greater than or about 5 times, greater than or about 10 times, greater than or about 25 times, greater than or about 50 times, greater than or about 100 times, or more. This may produce a carbon-containing layer selectively over the metal-containing material 310. Unlike self-assembled monolayers, which may be produced only to a few dozen Angstrom or less, the carbon-containing material of some embodiments of the present technology may be formed to a thickness of greater than or about 1 nm, and may be formed to a thickness of greater than or about 5 nm, greater than or about 10 nm, greater than or about 15 nm, greater than or about 20 nm, greater than or about 50 nm, greater than or about 75 nm, greater than or about 100 nm, or more.

In some embodiments the formation may be fully selective such that the carbon-containing material forms only over the metal-containing material, and little or no carbon-containing material may form on the exposed portions of the dielectric material. In some embodiments, an amount of coverage may occur overlying the dielectric material, although the amount may be reduced relative to the thickness formed overlying the metal-containing material. For example, an amount formed on the dielectric material may be characterized by a thickness that is less than or about 90% of a thickness formed over the metal-containing material, and the amount formed on the dielectric material may be characterized by a thickness that is less than or about 80% of a thickness formed over the metal-containing material, less than or about 70% of the thickness formed over the metal-containing material, less than or about 60% of the thickness formed over the metal-containing material, less than or about 50% of the thickness formed over the metal-containing material, less than or about 40% of the thickness formed over the metal-containing material, less than or about 30% of the thickness formed over the metal-containing material, less than or about 20% of the thickness formed over the metal-containing material, less than or about 10% of the thickness formed over the metal-containing material, less than or about 5% of the thickness formed over the metal-containing material, less than or about 1% of the thickness formed over the metal-containing material, or less, in some embodiments.

If material is formed over the dielectric material on which subsequent deposition may be performed, a subsequent process may be performed to re-expose the underlying dielectric material. For example, an oxidant may be delivered to the processing region to react with the carbon-containing material and etch an amount sufficient to expose the dielectric surface. The oxidation may be plasma enhanced, such as by providing an oxygen-containing precursor and forming a plasma to produce oxygen radical species, which may etch the carbon-containing material. Additionally, ozone or some other reactive material to remove carbon-containing material may be used, and which may not be plasma enhanced to limit additional damage to the blocking structure. Although the etch may additionally etch carbon-containing material to be maintained over the metal-containing material, the amount remaining may be sufficient to operate as a blocking layer. The method may then include performing a deposition of secondary or subsequent dielectric material on the exposed surface of dielectric material at operation 220. The deposited dielectric material may be the same or a different dielectric material as included in material 305.

Figure 3C:
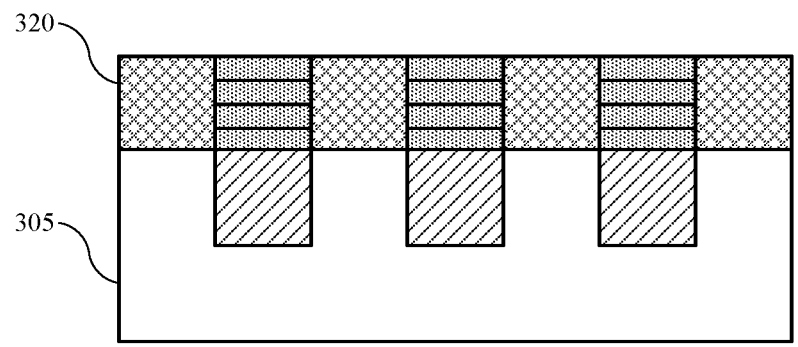

Because the blocking layer may limit or prevent interaction of the deposition material, the deposition may be performed to selectively deposit dielectric material on the exposed regions of dielectric material 305, while having little or no deposition on metal-containing material or the blocking material. As illustrated in FIG. 3C, dielectric material 320 may be deposited or formed on the exposed regions about the carbon-containing blocking material. The deposition may be to any thickness as discussed above, which may be facilitated by thicker blocking layers. Additionally, the deposition may be performed in any number of ways including chemical-vapor deposition, atomic-layer deposition, and plasma-enhanced deposition. Although the blocking layer may be affected and at least partially removed by the deposition process, at least a portion of the blocking layer may be maintained, which may allow a complete deposition to be performed in embodiments of the present technology.

Figure 3D:
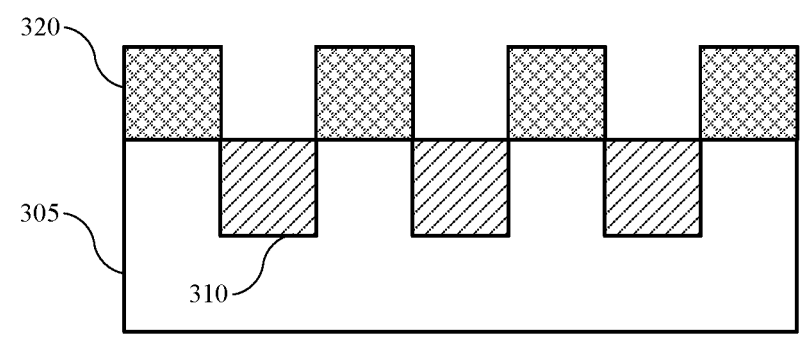

In some embodiments, method 200 may also include removing the layer of carbon-containing material at optional operation 225. While the etch back process discussed above may also be performed to fully remove the carbon-containing material, such as by oxidizing the carbon-containing material, some embodiments of the present technology may remove the carbon-containing material with an anneal. While the carbon-containing materials may be more thermally stable than self-assembled monolayers of material, the materials may still decompose at sufficient temperature. Accordingly, in some embodiments the material may be exposed to an anneal of greater than or about 300° C., and may be exposed to an anneal of greater than or about 350° C., greater than or about 400° C., greater than or about 450° C., greater than or about 500° C., greater than or about 550° C., greater than or about 600° C., or more. As illustrated in FIG. 3D, once the carbon-containing material has been removed, the structure may include the deposited dielectric materials 320, and exposed regions of metal-containing material 310.

Figure 3E:
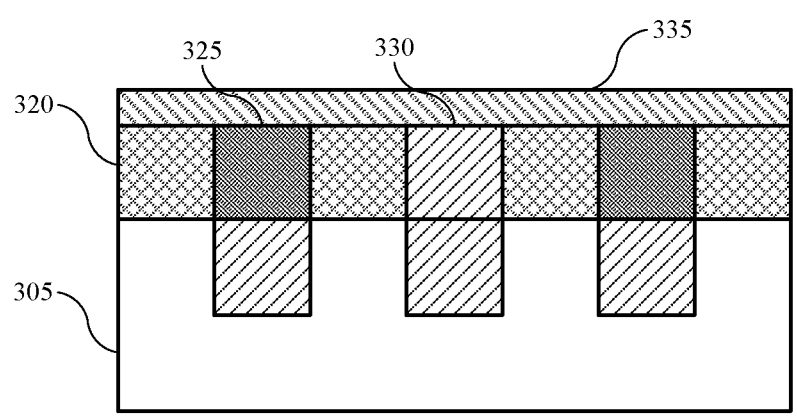

Depending on the process being performed, additional processing may then be performed to deposit material overlying the metal-containing material. For example, while forming metallization layers during back end of line processing, one or more of the exposed regions of metal-containing material 310 may be contacted with additional metal, and which may be separated by the selectively deposited dielectric materials. As one non-limiting example of forming a metal layer and redistribution process, as illustrated in FIG. 3E, additional processing may include depositing dielectric or other gapfill material 325 in some regions of exposed metal, while a metal via fill 330 may be formed to connect an underlying region of metal-containing material with a redistribution layer or overlying metallization layer 335. Any number of other processes may be performed in embodiments of the present technology in which subsequent deposition or processing may be performed over the exposed metal-containing materials.

The deposition temperature of the materials may impact the selectivity of the deposition between exposed metal-containing materials and exposed dielectric materials. For example, lower temperatures may increase residence time of the molecular deposition species, which may increase deposition on dielectric materials. However, by raising the temperature, residence time may be reduced, which may allow deposition preferentially on the metal-containing materials, and in some embodiments may form the carbon-containing materials only on the metal-containing materials. Accordingly, in some embodiments, forming the carbon-containing materials may be performed at a substrate temperature of greater than or about 100° C., and may be performed at a temperature of greater than or about 110° C., greater than or about 120° C., greater than or about 130° C., greater than or about 140° C., greater than or about 150° C., greater than or about 160° C., greater than or about 170° C., greater than or about 180° C., greater than or about 190° C., greater than or about 200° C., or more. However, as temperature continues to increase, growth rate may reduce, and decomposition may begin to occur. Accordingly, in some embodiments the temperature may be maintained at less than or about 300° C., and may be maintained at less than or about 280° C., less than or about 260° C., less than or about 240° C., less than or about 220° C., less than or about 200° C., or less.

The formation of the carbon-containing layer may utilize molecular deposition species characterized by materials facilitating long chain production, and which may selectively couple with the metal-containing materials at formation temperatures. For example, the first molecular species may be characterized by a head group that may more readily couple or bond with the exposed metal-containing material during a reduced residence time by utilizing elevated temperatures that may limit interaction with the dielectric materials. To facilitate coupling with the metal-containing material, the first molecular precursor may include a head group or functional group such as an amine, including a primary amine moiety, a thiol, such as a sulfhydryl moiety, a carboxyl moiety, or a hydroxyl moiety. Additionally, the head group may include a bi-functional or poly-functional material, such as a diol, diamine, dithiol, or other poly-functional materials. Non-limiting examples of the first molecular species may include ethylene diamine, phenylenediamine, a plasma of nitrogen or a nitrogen-containing material, such as ammonia, tris(2-aminoethyl)amine, or any number of other materials including amine head or tail moieties.

The second molecular species may include one or more groups facilitating interaction with the head group of the first molecular species. For example, the second molecular species may be characterized by a functional group including oxygen, such as an acyl chloride, an aldehyde, an isocyanate, or any number of other oxygen-containing functional groups. Additionally, head groups of the second molecular species may include bi-functional or poly-functional groups, such as dialdehydes, diacylchlorides, dianhydrides, diisocyantos, or other poly-functional groups. Non-limiting examples of the second molecular species may include phenylene diisocyanate, terephthaloyl chloride, terephthalaldehyde, or any number of other oxygen-containing materials. By performing molecular layer deposition according to some embodiments of the present technology, selective blocking of metal-containing materials may be performed, which may facilitate selective deposition of dielectric materials.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   forming a layer of carbon-containing material on a substrate disposed within a processing region of a semiconductor processing chamber, wherein the substrate comprises an exposed region of a first dielectric material and an exposed region of a metal-containing material, wherein the layer of carbon-containing material is selectively formed over the exposed region of the metal-containing material, and wherein forming the layer of carbon-containing material comprises one or more cycles of:
      providing a first molecular species that selectively couples with the metal-containing material, and
      providing a second molecular species that selectively couples with the first molecular species; and
   selectively depositing a second dielectric material on the exposed region of the first dielectric material.

2. The semiconductor processing method of claim 1, wherein the layer of carbon-containing material is formed to a thickness of greater than or about 5 nm.

3. The semiconductor processing method of claim 1, wherein forming the layer of carbon-containing material is performed at a substrate temperature of greater than or about 100° C.

4. The semiconductor processing method of claim 1, further comprising:
   performing an etch of the layer of carbon-containing material to expose the first dielectric material.

5. The semiconductor processing method of claim 1, further comprising:
    removing the layer of carbon-containing material by oxidizing the carbon-containing material or annealing the carbon-containing material.

6. The semiconductor processing method of claim 5, wherein the metal-containing material comprises a first metal-containing material, the semiconductor processing method further comprising:
    forming a second metal-containing material on the first metal-containing material.

7. The semiconductor processing method of claim 1, wherein the first molecular species is characterized by a head group comprising an amine, diamine, diol, or dithiol.

8. The semiconductor processing method of claim 7, wherein the second molecular species is characterized by a head group comprising oxygen.

9. The semiconductor processing method of claim 1, wherein selectively depositing the second dielectric material comprises a plasma-enhanced deposition.

10. The semiconductor processing method of claim 1, wherein forming the layer of carbon-containing material comprises at least 10 cycles.

11. A semiconductor processing method comprising:
    forming a layer of carbon-containing material on a substrate disposed within a processing region of a semiconductor processing chamber, wherein the substrate comprises an exposed region of a dielectric material and an exposed region of a metal-containing material, and wherein the layer of carbon-containing material is selectively formed over the exposed region of the metal-containing material to a thickness of at least twice a thickness formed on the dielectric material; and
    selectively depositing a second dielectric material on the exposed region of the dielectric material.

12. The semiconductor processing method of claim 11, wherein forming the layer of carbon-containing material comprises one or more cycles of:
    providing a first molecular species that selectively couples with the metal-containing material, and
    providing a second molecular species that selectively couples with the first molecular species.

13. The semiconductor processing method of claim 11, further comprising:
    removing the layer of carbon-containing material by oxidizing the carbon-containing material or annealing the carbon-containing material.

14. The semiconductor processing method of claim 11, wherein the layer of carbon-containing material is formed to a thickness of greater than or about 5 nm.

15. The semiconductor processing method of claim 11, wherein the metal-containing material comprises a first metal-containing material, the semiconductor processing method further comprising:
    forming a second metal-containing material on the first metal-containing material.

16. The semiconductor processing method of claim 11, wherein forming the layer of carbon-containing material is performed at a substrate temperature of greater than or about 100° C.

17. The semiconductor processing method of claim 11, further comprising:
    performing an etch of the layer of carbon-containing material to expose the dielectric material.

18. A semiconductor processing method comprising:
    forming a layer of carbon-containing material on a substrate disposed within a processing region of a semiconductor processing chamber at a substrate temperature of greater than or about 100° C., wherein the substrate comprises an exposed region of a first dielectric material and an exposed region of a metal-containing material, wherein the layer of carbon-containing material is selectively formed over the exposed region of the metal-containing material, and wherein forming the layer of carbon-containing material comprises one or more cycles of:
        providing a first molecular species that selectively couples with the metal-containing material, wherein the first molecular species comprises an amine head group, and
        providing a second molecular species that selectively couples with the first molecular species, wherein the second molecular species comprises oxygen; and
    selectively depositing a second dielectric material on the exposed region of the first dielectric material.

19. The semiconductor processing method of claim 18, further comprising:
    performing an etch of the layer of carbon-containing material to expose the first dielectric material.

20. The semiconductor processing method of claim 18, further comprising:
    removing the layer of carbon-containing material by oxidizing the carbon-containing material or annealing the carbon-containing material.

* * * * *